(12) United States Patent
Bai et al.

(10) Patent No.: US 10,399,328 B2
(45) Date of Patent: Sep. 3, 2019

(54) DEVICE AND METHOD FOR PRINTING SILICON SEALANT

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Xuefei Bai, Beijing (CN); Fuyi Cui, Beijing (CN); Fashun Li, Beijing (CN); Shixin Ruan, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 7 days.

(21) Appl. No.: 15/229,598

(22) Filed: Aug. 5, 2016

(65) Prior Publication Data

US 2017/0044663 A1    Feb. 16, 2017

(30) Foreign Application Priority Data

Aug. 13, 2015    (CN) .......................... 2015 1 0497994

(51) Int. Cl.
*C23C 16/04* (2006.01)
*B41J 2/005* (2006.01)
(Continued)

(52) U.S. Cl.
CPC .............. *B41J 2/005* (2013.01); *H01L 51/107* (2013.01); *H01L 51/448* (2013.01); *H01L 51/5253* (2013.01)

(58) Field of Classification Search
None
See application file for complete search history.

(56) References Cited

U.S. PATENT DOCUMENTS 3,603,286 A * 9/1971 Scopp ................... B05C 5/0212
                                                      118/410
3,608,535 A * 9/1971 Winston ................. F01C 19/10
                                                      123/193.2
(Continued)

FOREIGN PATENT DOCUMENTS

| CN | 104608513 A | 5/2015 |
| CN | 104802550 A | 7/2015 |

OTHER PUBLICATIONS

First Chinese Office Action dated Sep. 1, 2016; Appln. No. 201510497994.7.

*Primary Examiner* — Jethro M. Pence
(74) *Attorney, Agent, or Firm* — Ladas & Parry LLP

(57) ABSTRACT

A device for printing silicon sealant, including a coating device, a horizontal coating stage, and an elevating device, wherein: the elevating device is connected with the horizontal coating stage and is configured to adjust the height of the horizontal coating stage; the horizontal coating stage can be moved to a position right below a screen and fully contacted with the screen under the adjustment of the elevating device; and the coating device is configured to be moved to a position above the screen to coat silicon sealant in a pattern area of the screen after the horizontal coating stage is fully contacted with the screen.

15 Claims, 4 Drawing Sheets

(51) Int. Cl.
*H01L 51/10* (2006.01)
*H01L 51/44* (2006.01)
*H01L 51/52* (2006.01)

(56) References Cited

U.S. PATENT DOCUMENTS

| | | |
|---|---|---|
| 4,949,636 A | 8/1990 | Tachibana |
| 5,622,108 A | 4/1997 | Benedetto et al. |
| 2013/0316492 A1* | 11/2013 | Ushifusa ............... B41F 15/40 438/98 |
| 2014/0366797 A1* | 12/2014 | Horie ..................... B41F 15/42 118/56 |

\* cited by examiner

DEVICE AND METHOD FOR PRINTING SILICON SEALANT

TECHNICAL FIELD

The embodiments of the present disclosure relate to a device and method for printing silicon sealant.

BACKGROUND

Organic Light Emitting Diode (OLED) devices have advantages over liquid crystal Display (LCD) devices by self-emitting, quick response, wide angle of view, high brightness, vivid color, thin and light weight, and so on, and are deemed as next generation display technology.

Silicon sealant is a kind of encapsulating material for encapsulating an organic light emitting diode device, and when the OLED device is encapsulated, it is necessary to print the silicon sealant on a substrate of the OLED device.

SUMMARY

According to at least one embodiment of this disclosure, a device for printing silicon sealant is provided, which comprises a coating device, a horizontal coating stage, and an elevating device, wherein: the elevating device is connected with the horizontal coating stage and is configured to adjust the height of the horizontal coating stage; the horizontal coating stage can be moved to a position right below a screen and fully contacted with the screen under the adjustment of the elevating device; and the coating device is configured to be moved to a position above the screen to coat silicon sealant in a pattern area of the screen after the horizontal coating stage is fully contacted with the screen.

According to at least one embodiment of this disclosure, a method for printing silicon sealant is provided, which comprises: moving a horizontal coating stage to a position right below a screen, and adjusting the height of the horizontal coating stage by an elevating device so that the horizontal coating stage is fully contacted with the screen; and moving a coating device above the screen to coat the silicon sealant in a pattern area of the screen.

BRIEF DESCRIPTION OF THE DRAWINGS

In order to more clearly describe the technical solution of the embodiments of the present disclosure, the attached drawings for the embodiments will be briefly described, it is obvious that the attached drawings in the following description are only relevant to some embodiments of the present disclosure, but not are intended to limit the present disclosure.

DETAILED DESCRIPTION

Thereafter will describe the solutions according to the embodiments of the present disclosure clearly and fully in connection with the drawings in the embodiments of the present disclosure. Obviously, the embodiments described are only a part of embodiments of the present disclosure instead of all of the embodiments. All of other embodiments educing from the embodiments of the present disclosure by those ordinary skilled in the art without any inventive labors are fallen into the scope of the present disclosure.

The embodiments of the present disclosure provide a device and a method for printing silicon sealant, in order to improve the height of the printed silicon sealant and the uniformity of the width, and thereby the yield of the product can be increased.

Hereinafter, the device for printing silicon sealant and the method for printing silicon sealant, as provided by the embodiments of the present disclosure, will be described in detail in connection with the drawings.

Figure 1:
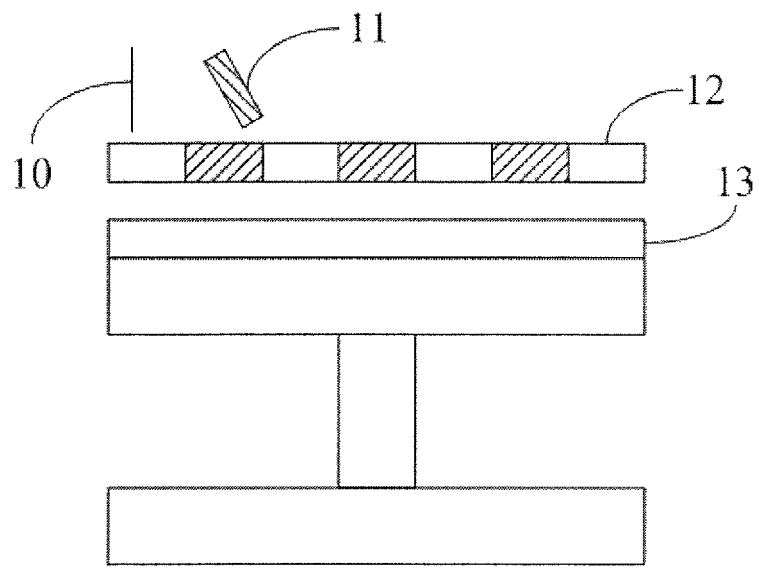
FIG. 1 is a schematic structural diagram of a device for printing silicon sealant.
Figure 2:
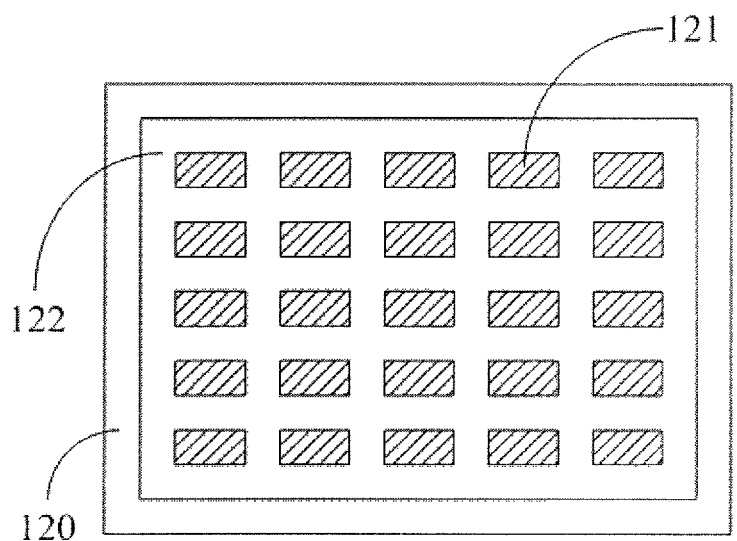
FIG. 2 is a schematic diagram illustrating plane structure of a screen.

As illustrated in FIG. 1, a device for printing silicon sealant includes a back feed blade 10 and a blade 11. When silicon sealant is printed, firstly, the silicon sealant is coated on a frame area of a screen 12, then the silicon sealant is scraped into a pattern area of the screen using the feed back blade 10, and then the silicon sealant in the pattern area is scraped on a substrate 13 by the blade 11. The screen 12 is a mask plate for printing silicon sealant, and on the mask plate there is a desirable pattern, and the structure of the screen is illustrated in FIG. 2, the screen 12 includes the frame area 120, the pattern area 121 and a silk screen area 122.

In this method, when the silicon sealant is scraped into the pattern area 121 of the screen 12 by the feed back blade 10, since the scraping is only carried out on the upper surface of the screen 12, there is no support on a lower surface of the screen 12, and the pattern area 121 of the screen 12 is penetrated up and down, if no support is provided on the lower surface of the screen 12, the silicon sealant can not be completely filled or uniformly filled in the pattern area of the screen 12, which will cause the silicon sealant having poor uniformity on its height and width after the silicon sealant in the pattern area 121 of the screen 12 is subsequently printed on the substrate 13 by the blade 11.

Figure 3A:
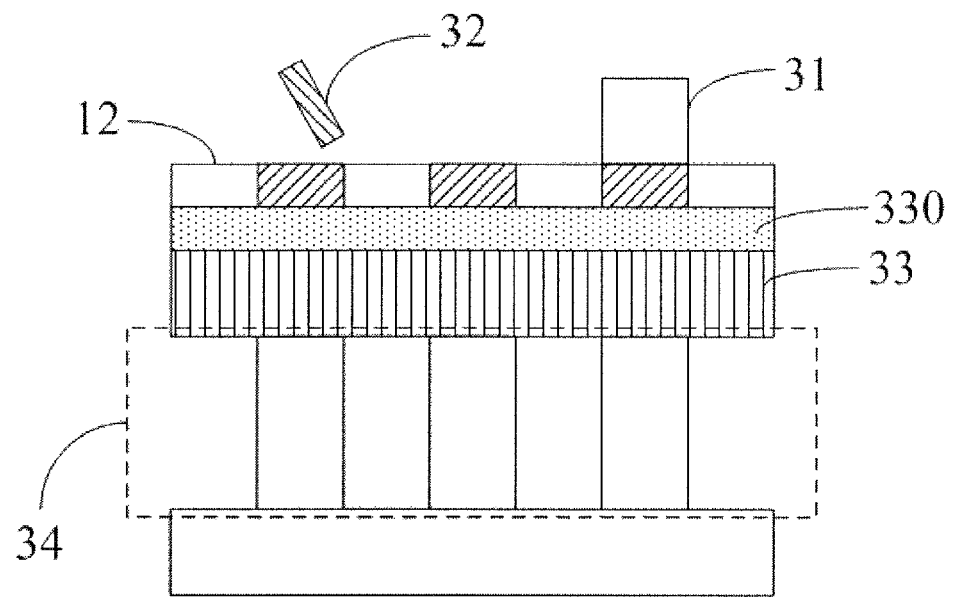
FIG. 3a is a schematic structural diagram of a device for printing silicon sealant as provided by embodiments of the present disclosure.
Figure 3B:
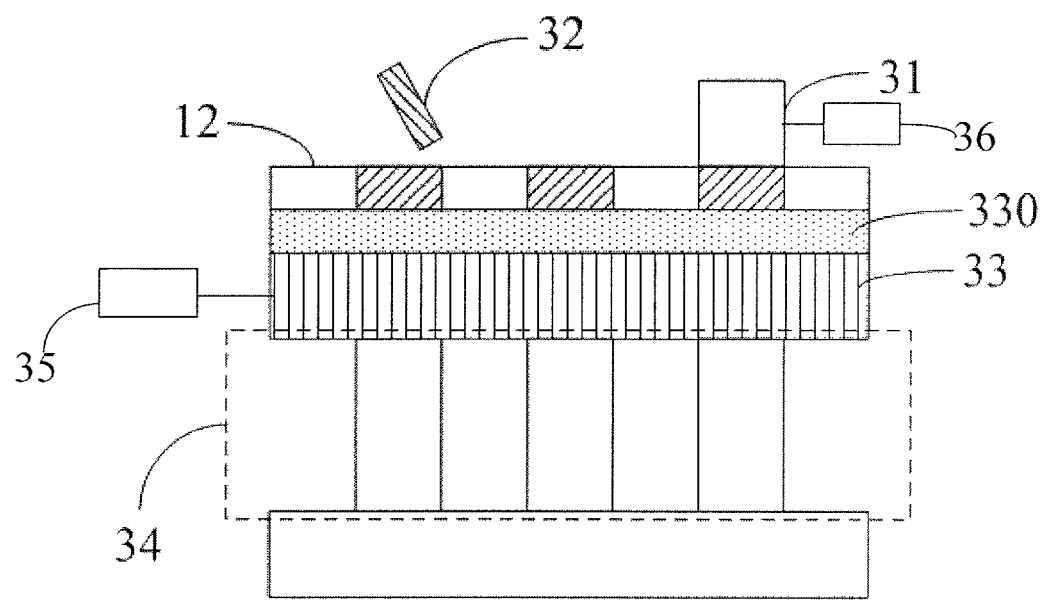
FIG. 3b is a schematic structural diagram of another device for printing silicon sealant as provided by embodiments of the present disclosure.

FIG. 3a and FIG. 3b show schematic structural diagrams of a device for printing silicon sealant according to embodiments of the present disclosure. As illustrated in FIG. 3a, embodiments of the present disclosure provides a device for printing silicon sealant, the device includes a coating device 31, a horizontal coating stage 33, and an elevating device 34, wherein:

the elevating device 34 is connected with the horizontal coating stage 33 for adjusting height of the horizontal coating stage 33;

the horizontal coating stage 33 is movable to a position right below the screen 12, and is fully contacted with the screen 12 under the adjustment of the elevating device 34; and the coating device 31 can coat the silicon sealant into the pattern area of the screen 12 after the horizontal coating stage 33 is fully contacted with the screen 12.

In addition, in order to print the silicon sealant on the substrate, according to examples of the present disclosure, the device for printing silicon sealant may further includes a scraper 32 for printing the silicon sealant in the pattern area of the screen 12 onto a substrate.

In addition, in order to effectively drive the horizontal coating stage to move, as illustrated in FIG. 3b, according to examples of the present disclosure, the device for printing silicon sealant may further includes a first driver 35 for driving the horizontal coating stage 33 to move to a position right below the screen 12. In order to accurately control the coating device 31 to coat the silicon sealant, according to examples of the present disclosure, the device for printing silicon sealant may further includes a second driver 36 for controlling the coating of the silicon sealant into the pattern area of the screen 12 after the horizontal coating stage 33 is fully contacted with the screen 12.

During the implementation, for example, the first driver 35 and the second driver 36 in the embodiments of the present disclosure may both are electric motors, and in other examples, the first driver may further include a driving component such as a screw. The scraper 32 in the embodiments of the present disclosure can be made from rubber material, flexible plastic material. The elevating device 34 in the embodiments of the present disclosure may be a device which can adjust the height of a structural component connected therewith, and the elevating device can adjust the height of the structural component connected therewith in a motor driving manner.

In the embodiments of the present disclosure, since the lower surface of the screen is supported by the horizontal coating stage 33 when the silicon sealant is coated into the pattern area of the screen 12, therefore, it is possible to better guarantee that the silicon sealant is completely filled or uniformly filled into the pattern area of the screen 12 during the coating.

According to examples of the present disclosure, in the embodiments of the present disclosure, a film layer 330 having non-adhesive character is provided on a surface of the horizontal coating stage 33. With the film layer 330 having non-adhesive character, it is possible to avoid the silicon sealant residual on the coating stage after the screen 12 is peeled off when the coating is completed and hence affect the next coating of the silicon sealant, at the same time, it is also possible to guarantee that the silicon sealant is completely filled in the pattern area of the screen 12.

Figure 4:
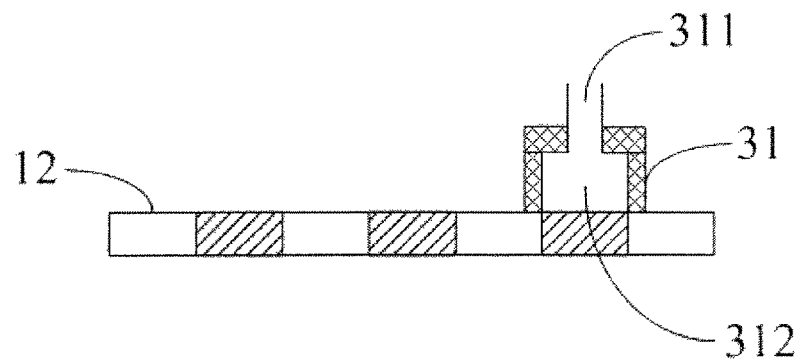
FIG. 4 is a schematic structural diagram of a coating device as provided by embodiments of the present disclosure.

As illustrated in FIG. 4, examples of the coating device 31 according to the embodiments of the present disclosure is a vessel having a certain volume, a first opening 311 and a second opening 312. The first opening 311 is used to load the silicon sealant into the vessel, and the second opening 312 is used to coat the silicon sealant in the vessel in the pattern area of the screen 12.

According to one example of the present disclosure, in the coating device 31 according to the embodiments of the present disclosure, the first opening 311 has size less than size of the second opening 312. Of course, during the practical design, the size of the first opening 311 may also be equal to the size of the second opening, the size of the first opening 311 may also be larger than the size of the second opening, and the size of the first opening 311 and the second opening 312 can be designed according to the requirement of the practical fabrication.

Figure 5:
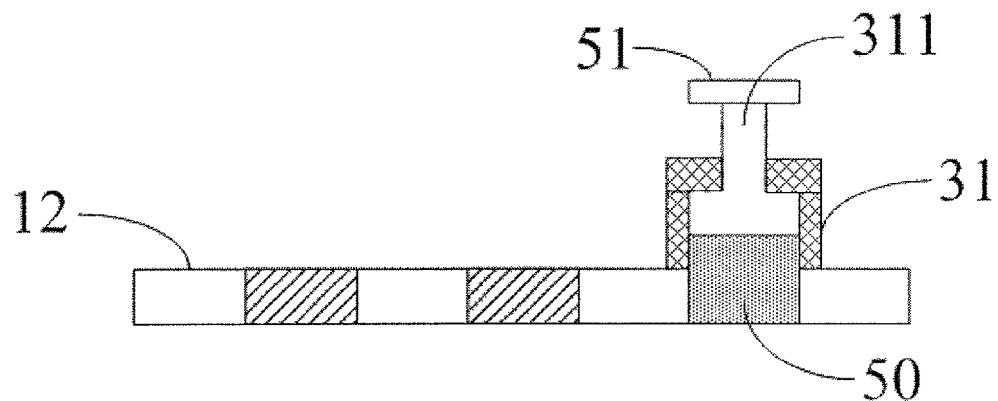
FIG. 5 is a schematic structural diagram of another coating device as provided by embodiments of the present disclosure.

According to examples of the present disclosure, as illustrated in FIG. 5, the coating device 31 according to the embodiments of the present disclosure may further includes a upper cover 51 for the first opening 311. The upper cover 51 is used to seal the first opening 311 after the silicon sealant is loaded into the vessel, to avoid overflowing of the excessive silicon sealant after being sealed, and to reduce spreading of the silicon sealant and has a certain protection for the cleanness of the silicon sealant.

Figure 6:
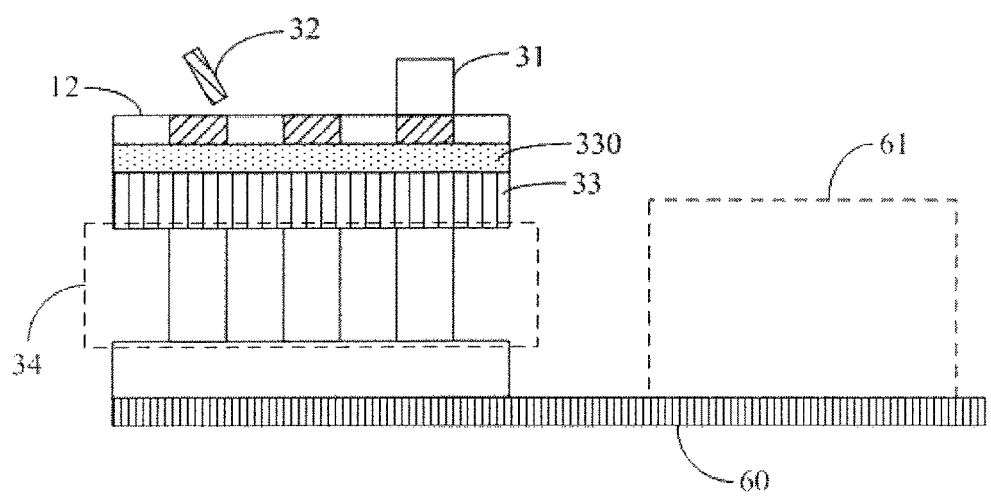
FIG. 6 is a schematic structural diagram of another device for printing silicon sealant as provided by embodiments of the present disclosure.

According to examples of the present disclosure, as illustrated in FIG. 6, the device for printing silicon sealant according to the embodiments of the present disclosure further includes a guide rail 60, along which the horizontal coating stage 33 is driven to move by the first driver 35. In implementation, firstly, the horizontal coating stage 33 starts at a standby position 61, when the silicon sealant is needed to be coated in the pattern area of the screen 12, the horizontal coating stage 33 is driven by the first driver 35 to move to a position right below the screen 12 along the guide rail 60, when the coating of the silicon sealant is completed, in the embodiments of the present disclosure, the horizontal coating stage 33 is driven by the first driver 35 to move to the standby position 61.

In the embodiments of the present disclosure, the guide rail 60 enables the first driver 35 to drive the horizontal coating stage 33 to move more conveniently, thus, the horizontal coating stage 33 can be moved along a predetermined track, and will not interfere with other structural components in the device for printing silicon sealant according to the embodiments of the present disclosure during the movement. Of course, during the practical design, the guide rail may not be provided, and the first driver 35 may drive the horizontal coating stage 33 to move along every direction in the space.

Figure 7:
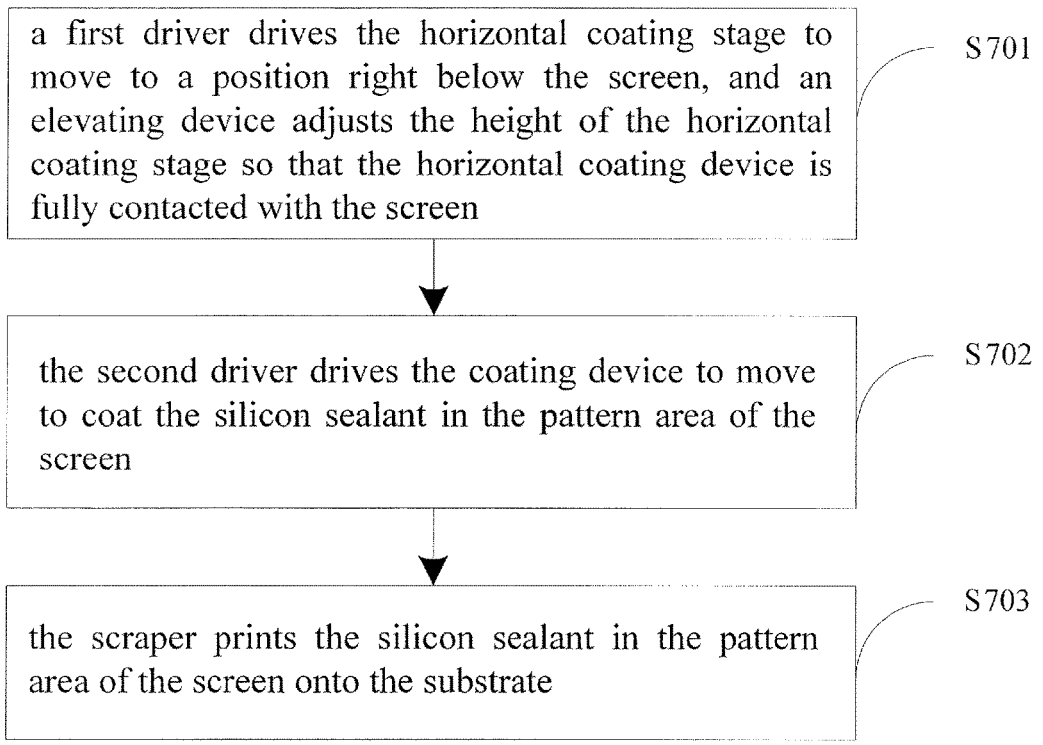
FIG. 7 is a flowchart illustrating a method for printing silicon sealant by using the device for printing silicon sealant, as provided by embodiments of the present disclosure.

As illustrated in FIG. 7, the embodiments of the present disclosure provides a method for printing silicon sealant by using the above device for printing silicon sealant provided by the embodiments of the present disclosure, the method includes:

S701, a first driver drives the horizontal coating stage to move to a position right below the screen, and an elevating device adjusts the height of the horizontal coating stage so that the horizontal coating device is fully contacted with the screen;

S702, the second driver drives the coating device to move to coat the silicon sealant in the pattern area of the screen; and S703, the scraper prints the silicon sealant in the pattern area of the screen onto the substrate.

According to examples of the present disclosure, as illustrated in FIG. 5, when the silicon sealant is printed, according to the embodiments of the present disclosure, firstly, the upper cover 51 of the coating device 31 is opened, and the silicon sealant is uniformly loaded in the coating device 31, the coating device 31 according to the embodiments of the present disclosure can contain a large amount of silicon sealant 50, so a large batch of printing can be done once time. Since in the embodiments of the present disclosure, the coating device 31 can be moved leftward, rightward, forward and backward, respectively, the coating device 31 can be reciprocated multiple times for coating, thereby small batch of coating can be done, and residual and waste of the used silicon sealant can be reduced, at the same time, by reciprocating coating, it is possible to guarantee that the pattern area of the screen 12 can be fully filled by the silicon sealant.

According to examples of the present disclosure, as illustrated in FIG. 6, in the embodiments of the present disclosure, the first driver drives the horizontal coating stage 33 to move from the standby position 61 to a position right below the screen along the guide rail 60. In the embodiments of the present disclosure, the surface of the horizontal coating stage 33 may be smooth and horizontal, so as to avoid the situation that the residual silicon sealant is remained below the screen after the subsequent coating of the silicon sealant and hence contaminate the substrate when the silicon sealant is subsequently printed onto the substrate.

During the practical design, in order to avoid that the horizontal coating stage 33 is collided with the screen 12 during the horizontal coating stage 33 is moved to the position right below the screen, it is possible to set the height value of the horizontal coating stage 33 to be less than the height value of the screen 12 in advance. Therefore, in the embodiments of the present disclosure, after the horizontal coating stage 33 is moved to the position right below the screen 12, in the embodiments of the present disclosure, under the adjustment of the elevating device 34, the horizontal coating stage 33 is moved upward to a position at which the horizontal coating stage 33 is completely contacted with the screen 12. After the screen 12 is contacted with the horizontal coating stage 33, the coating device 31 loaded with the silicon sealant is driven to move by a second driver according to the embodiments of the present disclosure, so as to coat the silicon sealant into the pattern area of the screen. After the coating is completed, in the embodiments of the present disclosure, the horizontal coating stage 33 is moved downward under the adjustment of the elevating device 34 to a predetermined height value. After that, the horizontal coating stage 33 according to the embodiments of the present disclosure is driven to move to the standby position 61 along the guide rail 60 by the first driver.

According to examples of the present disclosure, the substrate to be printed is moved to a position right below the screen, the interval between the substrate and the screen is adjusted to be a predetermined value which can be set according to the requirement in the practical production. And then the substrate is aligned with the screen. In the embodiments of the present disclosure, the substrate is aligned with the screen by using a camera, which is well known in the related art and will not be further described herein. After that, the scraper is contacted with the screen, to scrap the silicon sealant in the pattern area of the screen onto the substrate according to predetermined parameters including moving speed of the scraper, the press-in amount of the scraper, angle between the scraper and the screen, and so on. It is apparent to a person skilled in the art how to scrap the silicon sealant in the pattern area of the screen on the substrate, and thus will not be further described herein.

Figure 8:
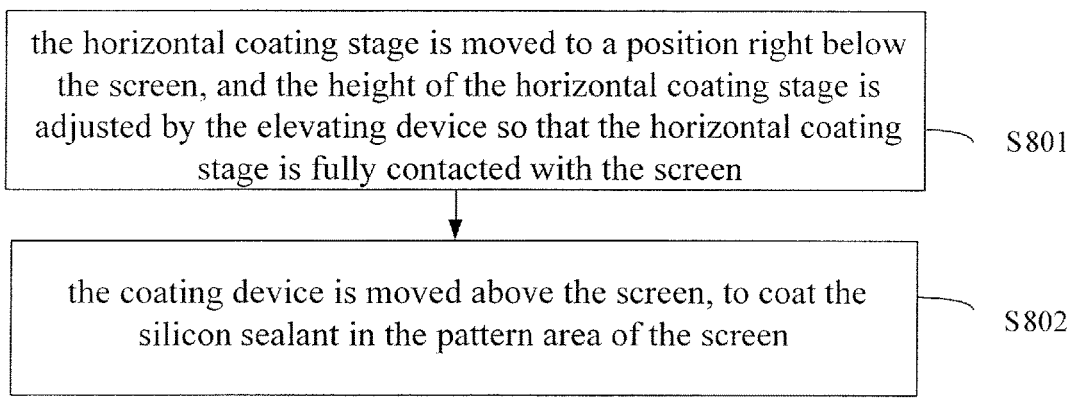
FIG. 8 is a flowchart illustrating another method for printing silicon sealant by using the device for printing silicon sealant, as provided by embodiments of the present disclosure.

With reference to FIG. 8, according to other embodiments of the present disclosure, a method for printing silicon sealant by using the device for printing silicon sealant provided by the above embodiments of the present disclosure includes the steps S801 to S802. In the step S801, the horizontal coating stage is moved to a position right below the screen, and the height of the horizontal coating stage is adjusted by the elevating device so that the horizontal coating stage is fully contacted with the screen. In the step S802, the coating device is moved above the screen, to coat the silicon sealant in the pattern area of the screen.

In addition, in order to print the silicon sealant on the substrate, according to examples of the present disclosure, the above method for printing silicon sealant further includes printing the silicon sealant in the pattern area of the screen on the substrate by the scraper.

In the embodiments of the present disclosure, by using the horizontal coating stage, the silicon sealant can be fully filled in the pattern area of the screen by the coating device, then by the scraper, the silicon sealant in the pattern area of the screen can be printed on the substrate. Because the pattern area of the screen can be fully filled by the silicon sealant, the uniformity of the height and width of the printed silicon sealant can be guaranteed, hence a series of product defects, such as silicon sealant crack, bubble, etc occurred after laser encapsulation, caused by different stress due to non-uniform height and width of the silicon sealant during the subsequent encapsulation can be avoided. And at the same time, the occurrence of Newton ring in the product can also be largely decreased due to the uniformity of the height and width of the silicon sealant.

In summary, the embodiments of the present disclosure provide a device and a method for printing silicon sealant. The device for printing silicon sealant includes a coating device, a scraper, a horizontal coating stage, an elevating device, a first driver and a second driver. Wherein the elevating device is connected with the horizontal coating stage to adjust the height of the horizontal coating stage. The horizontal coating stage can be moved to a position right below the screen under the driving of the first driver, and be fully contacted with the screen under the adjustment of the elevating device. The coating device is used to coat the silicon sealant into a pattern area of the screen under the driving of the second driver after the horizontal coating stage is fully contacted with the screen. And the scraper is used to print the silicon sealant in the pattern area of the screen on a substrate. Because the screen is fully contacted with the horizontal coating stage when the silicon sealant is coated into the pattern area of the screen in the embodiments of the present disclosure, thus the screen has a support below. Accordingly the pattern area of the screen can be fully filled or uniformly filled with the silicon sealant in the embodiments of the present disclosure, and thus the uniformity of the height and width of the printed silicon sealant can be improved, and the product yield can be increased.

The present application claims the priority of a Chinese Patent Application No., filed on, the disclosure of which is entirely incorporated herein by reference, as a part of the present application.

The application claims priority to the Chinese patent application No. 201510497994.7, filed on Aug. 13, 2015, the disclosure of which is incorporated herein in its entirety by reference as part of the application.

What is claimed is:

1. A device for printing silicon sealant, comprising a coating device, a horizontal coating stage, and an elevating device, wherein:

the elevating device is connected with the horizontal coating stage and is configured to adjust the height of the horizontal coating stage;

the horizontal coating stage is configured to support a substrate that is to be printed with silicon sealant, and configured to move to a position right below a screen and fully contacted with the screen under the adjustment of the elevating device before the substrate is placed on the horizontal coating stage;

the coating device is configured to be moved to a position above the screen to coat silicon sealant in a pattern area of the screen after the horizontal coating stage is fully contacted with the screen; and the coating device comprises a vessel for containing the silicon sealant;

the device for printing the silicon sealant further comprises a first driver, and the first driver is configured to drive the coating device to reciprocate above the screen in a horizontal direction for coating.

2. The device according to claim 1, further comprising a scraper configured to print the silicon sealant in the pattern area of the screen on the substrate on the horizontal coating stage after the substrate is positioned below the screen and an interval exists between the substrate and the screen.

3. The device according to claim 1, further comprising a second driver, wherein:

the second driver is configured to drive the horizontal coating stage to move to the position right below the screen.

4. The device according to claim 1, wherein:

the first driver is further configured to drive the coating device to move after the horizontal coating stage is fully contacted with the screen.

5. The device according to claim 1, wherein the vessel comprises a first opening, a second opening and a certain volume, the first opening is configured to load the silicon sealant into the vessel, and the second opening is configured to coat the silicon sealant in the vessel into the pattern area of the screen.

6. The device according to claim 5, wherein size of the first opening is less than the size of the second opening.

7. The device according to claim 5, wherein the coating device further comprising an upper cover set on the first opening, the upper cover is configured to seal the first opening after the silicon sealant is loaded in the vessel.

8. The device according to claim 1, further comprising a guide rail along which the horizontal coating stage is moved.

9. A method for printing silicon sealant with a device comprising a coating device, a horizontal coating stage, an elevating device and a first driver, the method comprising:

moving the horizontal coating stage to a position right below a screen before a substrate to be printed with silicon sealant is placed on the horizontal coating stage, adjusting a height of the horizontal coating stage by the elevating device so that the horizontal coating stage is fully contacted with the screen, and allowing the first driver to drive the coating device to reciprocate above the screen in a horizontal direction for coating the silicon sealant in a pattern area of the screen, wherein:

the elevating device is connected with the horizontal coating stage and is configured to adjust the height of the horizontal coating stage;

the horizontal coating stage is configured to support the substrate that is to be printed with silicon sealant, and configured to move to the position right below the screen and fully contacted with the screen under the adjustment of the elevating device before the substrate is placed on the horizontal coating stage;

the coating device is configured to be moved to a position above the screen to coat silicon sealant in the pattern area of the screen after the horizontal coating stage is fully contacted with the screen; and the coating device comprises a vessel for containing the silicon sealant;

the first driver is configured to drive the coating device to reciprocate above the screen in a horizontal direction for coating.

10. The method according to claim 9, further comprising:

placing the substrate on the horizontal coating stage, moving the substrate below the screen and allowing an interval between the substrate and the screen; and printing the silicon sealant in the pattern area of the screen on the substrate by a scraper.

11. The method according to claim 9, wherein the horizontal coating stage is driven to move to the position right below the screen by using the first driver.

12. The method according to claim 11, wherein, the horizontal coating stage is driven to move along a guide rail to the position right below the screen by using said first driver.

13. The method according to claim 12, wherein the coating device is moved to a position above the screen by using a second driver, to coat the silicon sealant in the pattern area of the screen.

14. The method according to claim 13, wherein after the coating device is driven to move by the second driver to coat the silicon sealant in the pattern area of the screen, the method further comprising:

the horizontal coating stage is driven by the first driver to move to a standby position for the horizontal coating stage along the guide rail.

15. The method according to claim 10, wherein before printing the silicon sealant in the pattern area of the screen on the substrate by the scraper, the interval is adjusted to a predetermined value, and then the substrate is aligned with the screen; the scraper is contacted with the screen so as to scrape the silicon sealant in the pattern area of the screen on the substrate according to predetermined parameters.

* * * * *